United States Patent
Kurokawa

(10) Patent No.: US 6,926,546 B2
(45) Date of Patent: Aug. 9, 2005

(54) FOLDABLE ELECTRONIC DEVICE FORMED BY PIVOTALLY CONNECTING TWO CASINGS THROUGH HINGE

(75) Inventor: Tomoyasu Kurokawa, Fussa (JP)

(73) Assignee: Casio Computer Co., Ltd., Tokyo (JP)

(*) Notice: Subject to any disclaimer, the term of this patent is extended or adjusted under 35 U.S.C. 154(b) by 0 days.

(21) Appl. No.: 10/867,695

(22) Filed: Jun. 14, 2004

(65) Prior Publication Data

US 2004/0266239 A1 Dec. 30, 2004

(30) Foreign Application Priority Data

Jun. 25, 2003 (JP) ........................................ 2003-181464

(51) Int. Cl.⁷ ................................................. H01R 3/00
(52) U.S. Cl. ...................... 439/165; 439/31; 439/492; 439/446; 174/254; 455/550.1
(58) Field of Search ................................. 439/165, 446, 439/31, 492; 174/254; 455/550.1

(56) References Cited

U.S. PATENT DOCUMENTS

| | | | |
|---|---|---|---|
| 4,885,430 A | * 12/1989 | Kinser et al. | ............... 361/749 |
| 6,447,315 B1 | * 9/2002 | Pan et al. | ................... 439/165 |
| 6,754,507 B2 | * 6/2004 | Takagi | ..................... 455/550.1 |
| 6,829,490 B2 | * 12/2004 | Nakamura et al. | ....... 455/550.1 |

FOREIGN PATENT DOCUMENTS

| | | |
|---|---|---|
| JP | 2001-044877 A | 2/2001 |
| JP | 2002-319771 A | 10/2002 |

* cited by examiner

*Primary Examiner*—Truc Nguyen
(74) *Attorney, Agent, or Firm*—Frishauf, Holtz, Goodman & Chick, P.C.

(57) ABSTRACT

A plurality of wound portions are formed on a wiring cable to be arranged in a two-axis hinge that connects two casings. Winding directions of the wound portions which are adjacent are set opposite to each other. In a foldable electronic device in which two casings are pivotally connected to each other through a two-axis hinge having two pivot shafts, the wiring cable is arranged in the two-axis hinge. One wound portion of the wiring cable is wound around one pivot shaft of the two-axis hinge. The other wound portion of the wiring cable is wound around the other pivot shaft of the two-axis hinge.

17 Claims, 8 Drawing Sheets

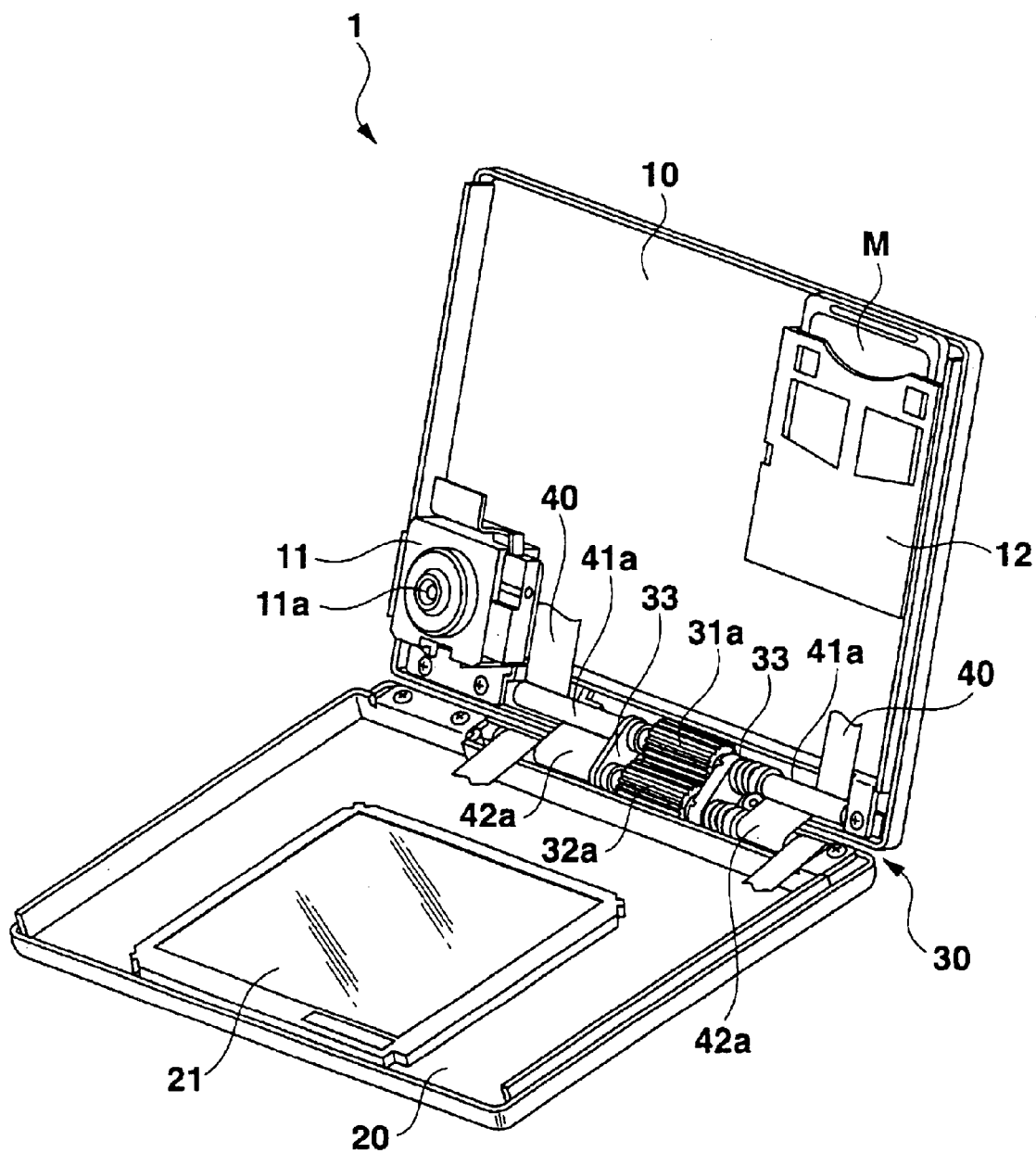

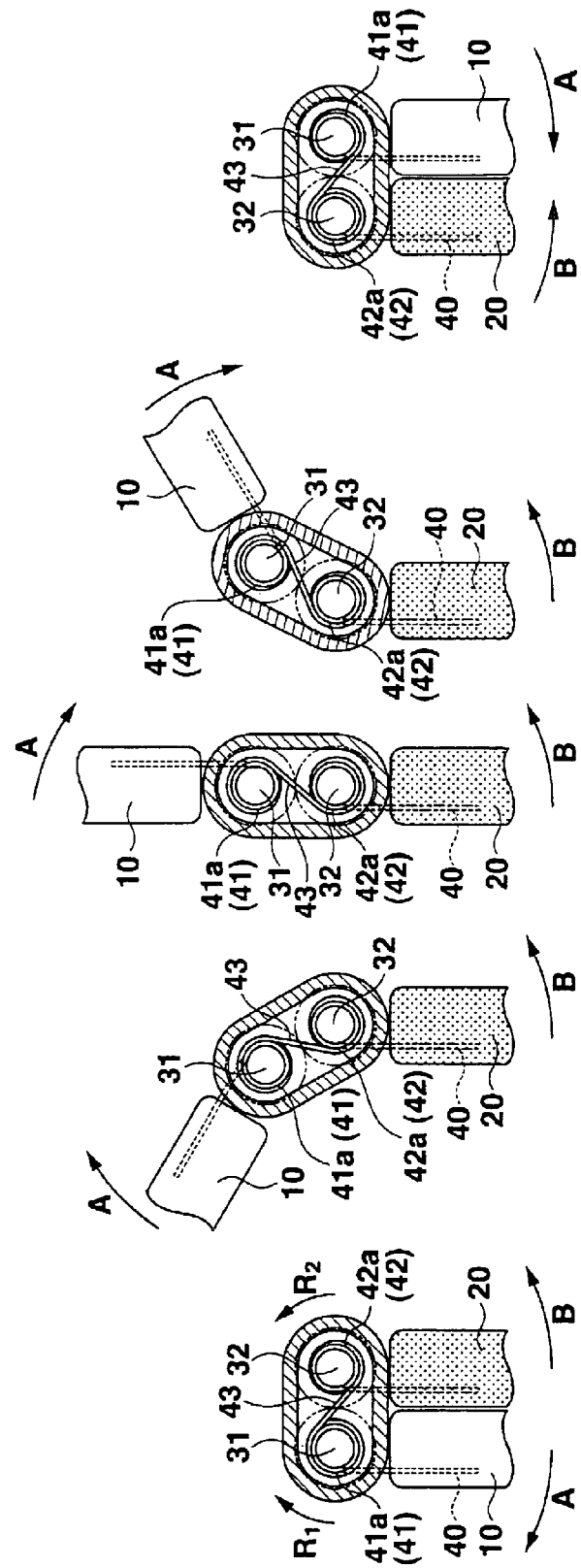

FOLDABLE ELECTRONIC DEVICE FORMED BY PIVOTALLY CONNECTING TWO CASINGS THROUGH HINGE

CROSS-REFERENCE TO RELATED APPLICATIONS

This application is based upon and claims the benefit of priority from prior Japanese Patent Application No. 2003-181464, filed Jun. 25, 2003, the entire contents of which are incorporated herein by reference.

BACKGROUND OF THE INVENTION

1. Field of the Invention

The present invention relates to a foldable electronic device formed by pivotally connecting two casings through a hinge, and a cable wiring method for the same.

2. Description of the Related Art

Conventionally, foldable electronic devices (e.g., a portable cellular phone set, PDA, notebook PC, and digital camera) have been proposed and put into practical use. Each of these devices is formed by pivotally connecting two casings through a hinge. As shown in FIGS. 8A through 8D, a cable 200 to electrically connect one casing 110 with the other casing 120 is arranged in such a foldable electronic device 100.

Part of the cable 200 is arranged in a hinge 130 provided between one and the other casings 110 and 120 (see FIG. 8A). When part of the cable 200 is to be arranged in the hinge 130 having one pivot shaft 131 as shown in FIG. 8A, part of the cable 200 is generally wound around the pivot shaft 131.

It is an object of the present invention to provide a foldable electronic device which suppresses an enlargement of the wound portion of a wiring cable to be arranged in a hinge that connects two casings, which accompanies pivot motion of the casings, to enable a decrease in space occupied by the wound portion, and a cable wiring method for the same.

BRIEF SUMMARY OF THE INVENTION

According to one aspect of the present invention, there is provided a foldable electronic device comprising a first casing, a second casing, a two-axis hinge having first and second pivot shafts to pivotally connect the first and second casings, and a wiring cable to electrically connect the first and second casings through the two-axis hinge, wherein the wiring cable is wound around the first pivot shaft of the two-axis hinge in a first direction, and around the second pivot shaft of the two-axis hinge in a second direction opposite to the first direction.

According to another aspect of the present invention, there is provided a method of wiring a cable in a hinge that connects two casings, wherein a plurality of wound portions are formed on the cable, and winding directions of the wound portions which are adjacent are set opposite to each other.

BRIEF DESCRIPTION OF THE SEVERAL VIEWS OF THE DRAWING

FIG. 2 is a perspective view of the digital camera shown in FIG. 1;

FIGS. 5A through 5E are views for explaining the wound states of the first and second wound portions of the FPC cable wound around the first and second pivot shafts of the two-axis hinge of the digital camera shown in FIG. 1;

DETAILED DESCRIPTION OF THE INVENTION

The embodiments of the present invention will be described in detail with reference to the accompanying drawing.

[First Embodiment]

The first embodiment of the present invention will be described first with reference to FIGS. 1 through 6B. In this embodiment, the foldable electronic device according to the present invention will be exemplified by a digital camera 1 having a two-axis hinge 30. As an example of a wiring cable according to the present invention, an FPC cable 40 to be arranged in the two-axis hinge 30 of the digital camera 1 is employed.

Figure 1:
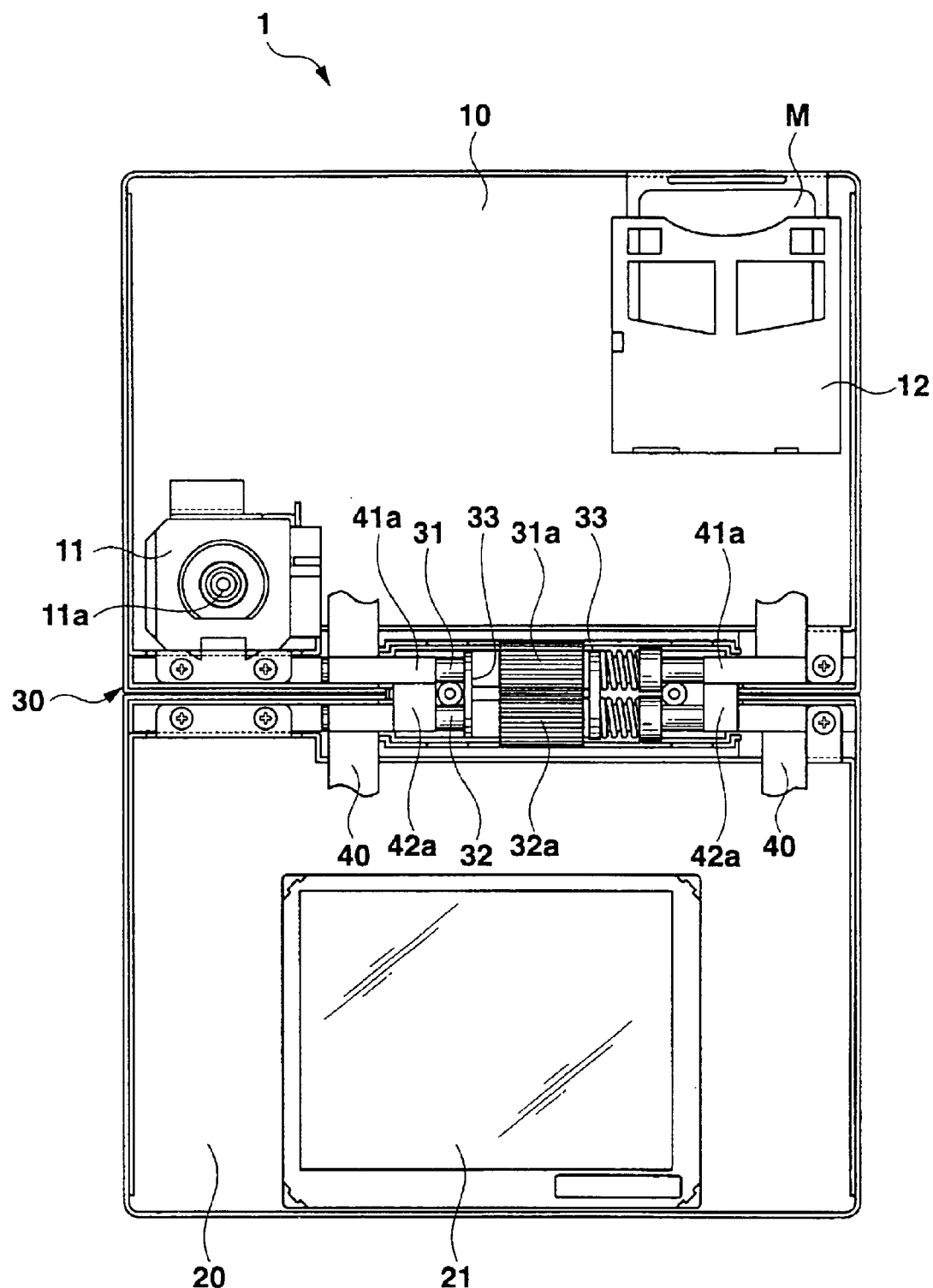
FIG. 1 is a plan view of a foldable electronic device (digital camera) according to the first embodiment of the present invention.
Figure 3A:
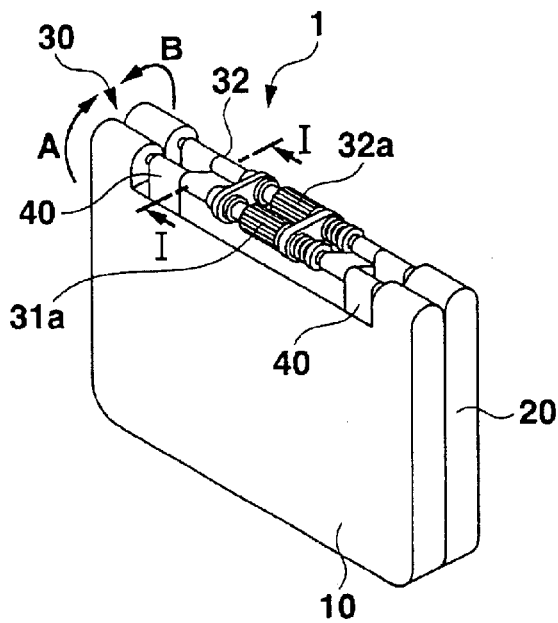
FIG. 3A is a perspective view showing a carrying state of the digital camera shown in FIG. 1.
Figure 3B:
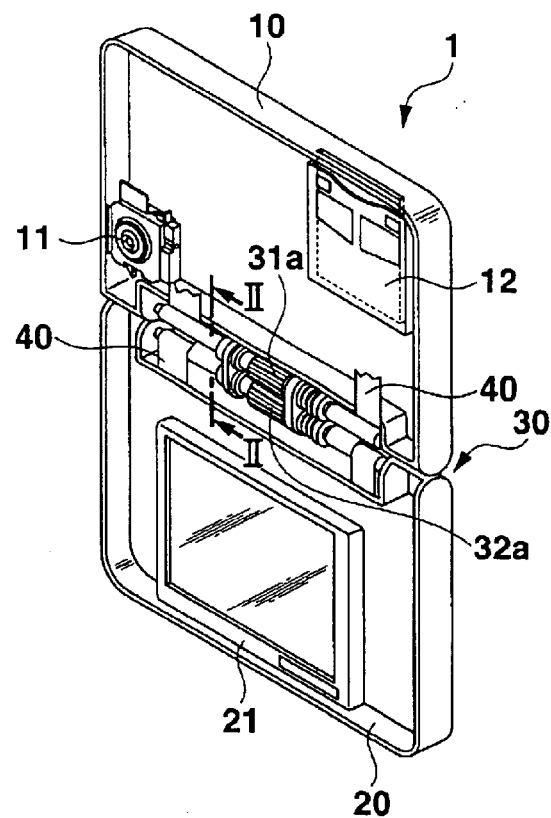
FIG. 3B is a perspective view showing a state wherein the first and second casings of the digital camera in the carrying state of FIG. 3A are pivoted each by 90°.
Figure 3C:
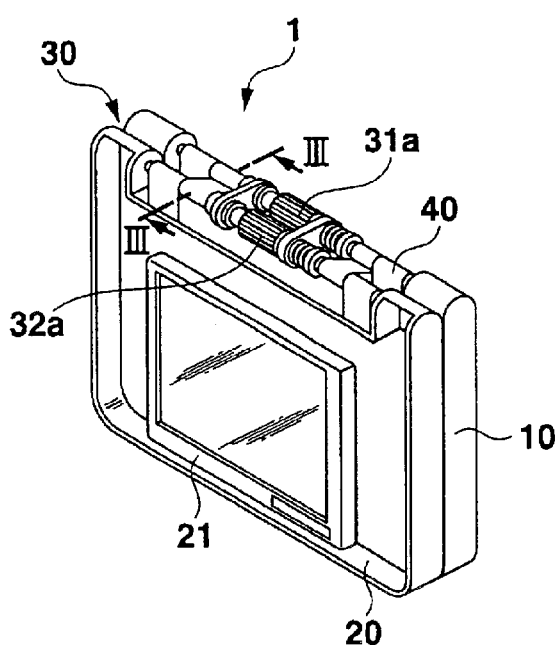
FIG. 3C is a perspective view showing an image sensing state of the digital camera shown in FIG. 1.
Figure 4:
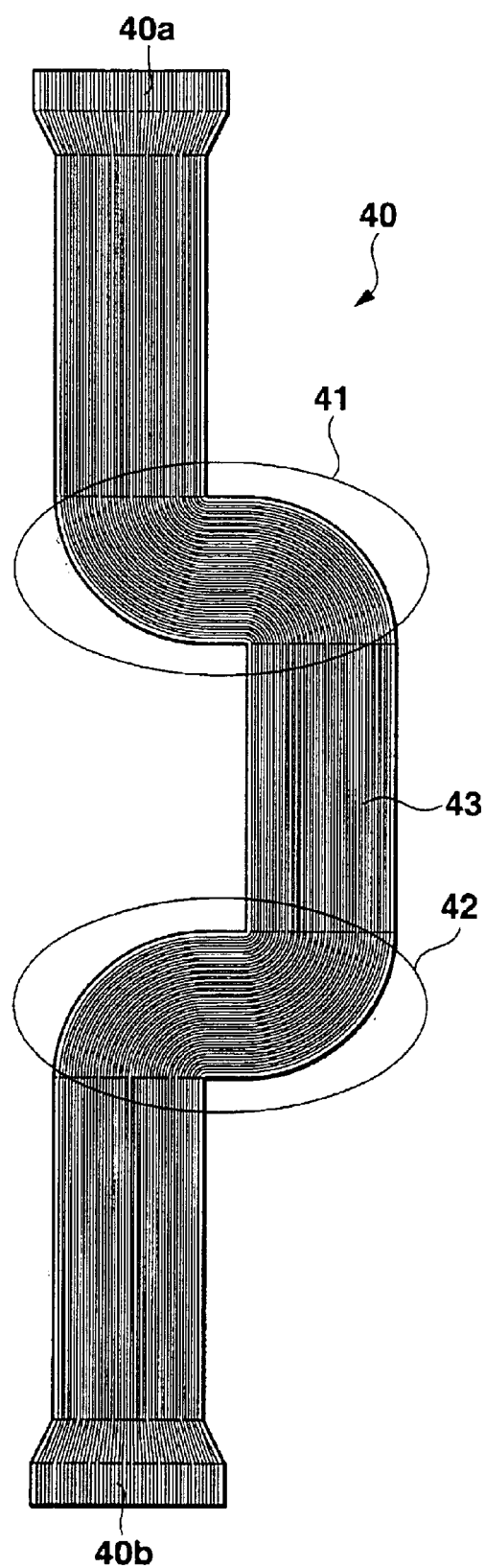
FIG. 4 is a plan view of an FPC cable provided to the digital camera shown in FIG. 1.

The entire arrangement of the digital camera 1 according to this embodiment will be described with reference to FIGS. 1 through 4. FIG. 1 is a plan view of the digital camera in an open state. FIG. 2 is a perspective view of the digital camera 1 in the open state. FIG. 3A is a perspective view showing a state (to be referred to as a "carrying state" hereinafter) wherein the inner side surfaces of first and second casings 10 and 20 of the digital camera 1 oppose each other. FIG. 3B is a perspective view showing a state wherein the first and second casings 10 and 20 are pivoted to open from the carrying state of FIG. 3A. FIG. 3C is a perspective view showing a state (to be referred to as an "image sensing state" hereinafter) in which the outer side surfaces of the first and second casings 10 and 20 oppose each other. FIG. 4 is a plan view of each FPC cable 40.

The digital camera 1 is built up of the first and second casings 10 and 20, two-axis hinge 30, FPC cable 40, and the like. The first casing 10 includes an image sensing portion 11 and the like. The second casing 20 includes a display 21 and the like. The two-axis hinge 30 pivotally connects the first and second casings 10 and 20. The FPC cable 40 electrically connects components in the first and second casings 10 and 20.

As shown in FIGS. 1 and 2, the first casing 10 is a low-profile casing made of a metal material such as aluminum or stainless steel, and has a substantially rectangular parallelepiped shape. The image sensing portion 11, a card slot portion 12, an electronic flash emitting portion, a self-timer lamp, a controller, and the like are mounted in the first casing 10. The image sensing portion 11 includes a lens, CCD, and the like. A memory card M to record respective types of data and image information acquired by the image sensing portion 11 is mounted in the card slot portion 12. The electronic flash emitting portion irradiates an object with light when sensing an image in a dark place. The self-timer lamp informs the user of the image-sensing timing during automatic image sensing. The controller comprehensively controls the entire digital camera 1. A lens 11a of the image sensing portion 11 is arranged to face the inner side of the first casing 10. The electronic flash emitting portion, self-timer lamp, and controller are not shown.

The controller includes a CPU, ROM, RAM, and the like. The CPU comprehensively controls the entire digital camera 1. The ROM stores various types of control programs and the like. The RAM serves as a work area where image information is temporarily stored and the control programs are temporarily expanded. The controller is electrically connected to the image sensing portion 11 and card slot portion 12. The controller is also electrically connected to the display 21 and operating portion of the second casing 20 through the FPC cable 40. Upon reception of an operation signal from the operating portion of the second casing 20, the controller controls the image sensing portion 11 to realize predetermined image sensing operation.

As shown in FIGS. 1 and 2, the second casing 20 is a low-profile casing made of a metal material such as aluminum or stainless steel, and has a substantially rectangular parallelepiped shape. The display 21, the operating portion, a viewfinder eyepiece, and the like are mounted on the second casing 20. The display 21 acquires and displays through the FPC cable 40 still image information and motion image information of the object acquired by the image sensing portion 11 mounted on the first casing 10. The display 21 also acquires and displays through the FPC cable 40 still image information and motion image information of the object recorded on the memory card M mounted in the card slot portion 12 in the first casing 10. The operating portion includes a shutter release key used for image sensing, function keys for selecting modes, and the like. The display 21 and operating portion are electrically connected to the controller mounted in the first casing 10 through the FPC cable 40 (to be described later). The display 21 and operating portion are controlled by the CPU of the controller. The operating portion and viewfinder eyepiece are not shown.

The two-axis hinge 30 includes first and second pivot shafts 31 and 32, first and second gears 31a and 32a, bearing 33, and the like. The first pivot shaft 31 is fixed to the first casing 10. The first gear 31a is formed on part of the outer surface of the first pivot shaft 31. The second pivot shaft 32 is fixed to the second casing 20. The second gear 32a is formed on part of the outer surface of the second pivot shaft 32 and meshes with the first gear 31a. The bearing 33 pivotally supports the first and second pivot shafts 31 and 32.

The first pivot shaft 31 is fixed to the end of the first casing 10, and the second pivot shaft 32 is fixed to the end of the second casing 20 (see FIGS. 1 and 2). The first and second gears 31a and 32a respectively formed on part of the outer surfaces of the first and second pivot shafts 31 and 32 pivot by the same angle in opposite directions.

Assume that an external force that separates the first and second casings 10 and 20 from each other is applied to the digital camera 1 in the carrying state (see FIG. 3A). Then, the external force is transmitted to the two-axis hinge 30 and the first and second gears 31a ad 32a pivot by the same angle in the opposite directions. Consequently, the first and second casings 10 and 20 respectively fixed to the first and second gears 31a and 32a pivot by the same angle in the opposite directions.

FIG. 3B shows a state wherein the first and second casings 10 and 20 (first and second gears 31a and 32a) have pivoted from the carrying state of FIG. 3A each by 90° in directions of arrows A and B, respectively. FIG. 3C shows a state wherein the first and second casings 10 and 20 (first and second gears 31a and 32a) have pivoted from the carrying state of FIG. 3A each by 180° in the directions of the arrows A and B.

When the digital camera 1 is to be carried, the inner side surfaces of the first and second casings 10 and 20 are opposed to each other so that the image sensing portion 11 and display 21 can be stored inside (see FIG. 3A). When image sensing is to be performed by using the digital camera 1, the outer side surfaces of the first and second casings 10 and 20 are opposed to each other so that the image sensing portion 11 and display 21 can be exposed (see FIG. 3C).

The FPC cable 40 is an elongated band-like cable formed by adhering adhesive tapes to the two surfaces of an array of a plurality of wire cables arranged at a predetermined interval (see FIG. 4). A terminal 40a formed at one end of the FPC cable 40 is connected to the controller and the like in the first casing 10. A terminal 40b formed at the other end of the FPC cable 40 is connected to the display 21 and the like in the second casing 20.

First and second bent portions 41 and 42 are formed at substantially the central portion in the longitudinal direction of the FPC cable 40 (see FIG. 4). The first and second bent portions 41 and 42 are formed by joining two substantially right-angled corners, and are linked to each other through an intermediate portion 43. The first bent portion 41 is wound around the first pivot shaft 31 of the two-axis hinge 30 to form a first wound portion 41a. The second bent portion 42 is wound around the second pivot shaft 32 of the two-axis hinge 30 to form a second wound portion 42a (see FIGS. 1 and 2).

A wiring method for the FPC cable 40 will be described with reference to FIGS. 5A through 5E. FIGS. 5A through 5E are views for explaining the wound states of the first and second wound portions 41a and 42a of the FPC cable 40 formed around the first and second pivot shafts 31 and 32 of the two-axis hinge 30.

FIG. 5A is a sectional view of a portion taken along the line I—I of FIG. 3A. FIG. 5B is a sectional view of the two-axis hinge 30 in a state wherein the first and second casings 10 and 20 have been pivoted from the carrying state of FIG. 3A each by about 60° in the opposite directions. FIG. 5C is a sectional view of a portion taken along the line II—II of FIG. 3B. FIG. 5D is a sectional view of the two-axis hinge 30 in a state wherein the first and second casings 10 and 20 have been pivoted from the carrying state of FIG. 3A each by about 120° in the opposite directions. FIG. 5E is a sectional view of a portion taken along the line III—III of FIG. 3C.

The first bent portion 41 of the FPC cable 40 is wound around the first pivot shaft 31 of the two-axis hinge 30 in the direction of an arrow $R_1$ (see FIG. 5A) to form the first wound portion 41a. The second bent portion 42 linked to the first bent portion 41 through the intermediate portion 43 is wound around the second pivot shaft 32 of the two-axis hinge 30 in the direction of an arrow $R_2$ (see FIG. 5A) to form the second wound portion 42a. The winding directions $R_1$ and $R_2$ of the first and second wound portions 41a and 42a, respectively, are set opposite to each other.

Assume that the first casing 10 is pivoted from the carrying state of FIG. 3A in the direction of the arrow A about the first pivot shaft 31 of the two-axis hinge 30 as the center. Then, the first wound portion 41a formed around the first pivot shaft 31 is gradually unwound, and the cable (intermediate portion 43) is gradually fed to the second wound portion 42a side (see FIGS. 5B through 5D). Interlocked with the pivot of the first casing 10 in the direction of the arrow A, the second casing 20 pivots in the direction of the arrow B about the second pivot shaft 32 of the two-axis hinge 30 as the center. The fed-out cable (intermediate portion 43) is accordingly taken up by the second pivot shaft 32 (see FIGS. 5B through 5D). Thus, enlargement of the first wound portion 41a of the FPC cable 40 is suppressed.

Assume that the first and second casings 10 and 20 are pivoted from the carrying state of FIG. 3A each by about 180° in the directions of the arrows A and B, respectively. The digital camera 1 shifts to the image sensing state of FIG. 3C. The winding state of the first wound portion 41a of the FPC cable 40 in the image sensing state is the same as that of the second wound portion 42a of the FPC cable 40 in the carrying state (see FIGS. 5A and 5E). The winding state of the second wound portion 42a of the FPC cable 40 in the image sensing state is the same as that of the first wound portion 41a of the FPC cable 40 in the carrying state (see FIGS. 5A and 5E).

In the digital camera 1 according to the embodiment described above, the FPC cable 40 is arranged in the two-axis hinge 30. The first wound portion 41a of the FPC cable 40 is formed around the first pivot shaft 31 of the two-axis hinge 30. The second wound portion 42a of the FPC cable 40 is formed around the second pivot shaft 32 of the two-axis hinge 30. The winding directions $R_1$ and $R_2$ of the first and second wound portions 41a and 42a, respectively, are set opposite to each other (see FIGS. 5A through 5E).

As the first and second casings 10 and 20 are pivoted in the opposite directions from the carrying state of FIG. 3A, the first wound portion 41a is unwound and the cable (intermediate portion 43) is gradually fed to the second wound portion 42a side. In this case as well, the fed-out cable (intermediate portion 43) can be taken up by the second pivot shaft 32.

Figure 6A:
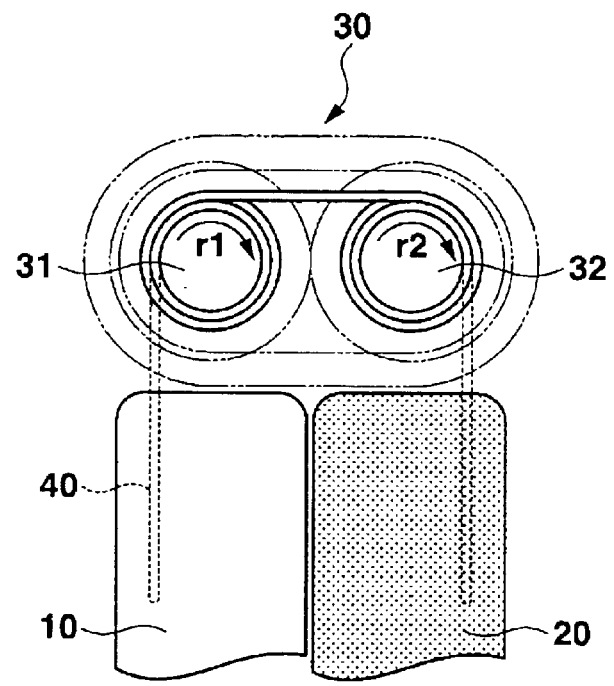
FIGS. 6A and 6B are views for explaining a state wherein the FPC cable is wound in the same direction around the first and second pivot shafts of the two-axis hinge of the digital camera shown in FIG. 1.
Figure 6B:
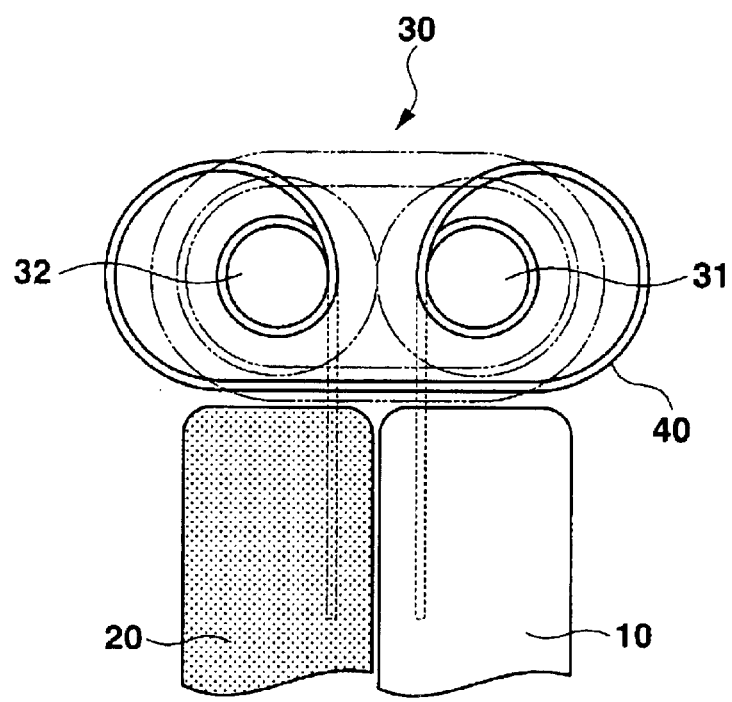

When winding the FPC cable 40 around the first and second pivot shafts 31 and 32, assume that the winding directions around the first and second pivot shafts 31 and 32 are set in the same direction ($r_1$, $r_2$; see FIG. 6A). Then, the cable take-up operation described above becomes impossible. More specifically, assume that the second casing 20 is pivoted substantially by 360° with respect to the first casing 10 about the two-axis hinge 30 as the center. Then, those portions of the FPC cable 40 which are wound around the first and second pivot shafts 31 and 32 become loose and their diameters increase (see FIG. 6B).

In contrast to this, in the digital camera 1 according to this embodiment, the winding directions $R_1$ and $R_2$ of the first and second wound portions 41a and 42a, respectively, of the FPC cable 40 are set opposite to each other. Thus, enlargement of the first wound portion 41a of the FPC cable 40 can be suppressed. Therefore, the storing space in the two-axis hinge 30 for the FPC cable 40 can be decreased, so that the decrease in size and weight of the digital camera 1 can be achieved.

[Second Embodiment]

Figure 7:
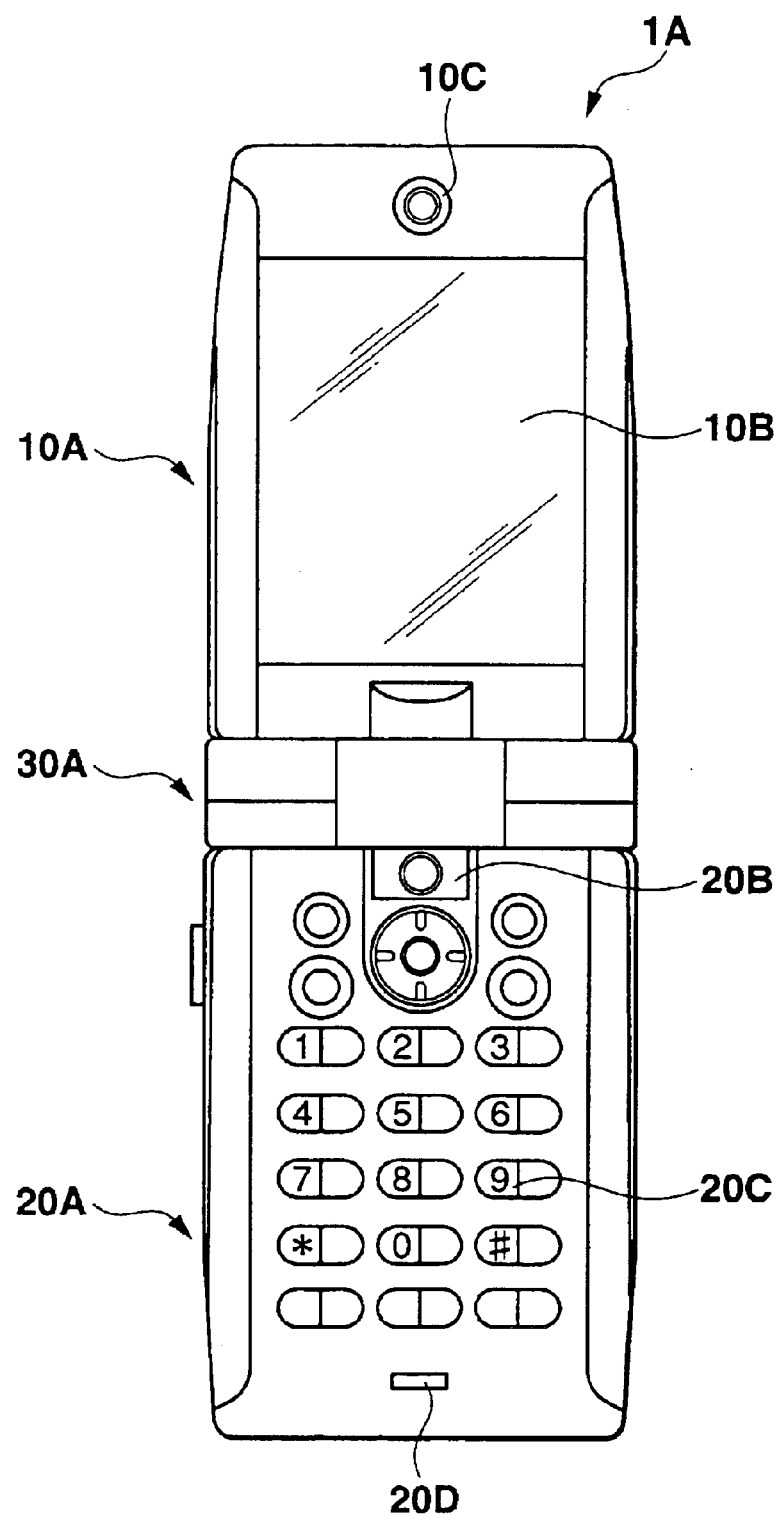
FIG. 7 is a plan view of a foldable electronic device (portable cellular phone set) according to the second embodiment of the present invention.
Figure 8A:
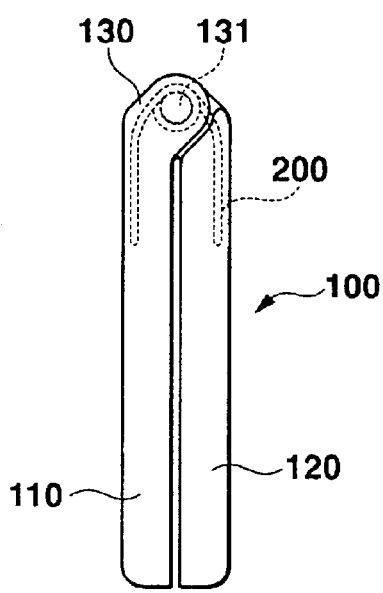
FIGS. 8A through 8D are views for explaining a state wherein a cable is wound around a conventional one-axis hinge.
Figure 8B:
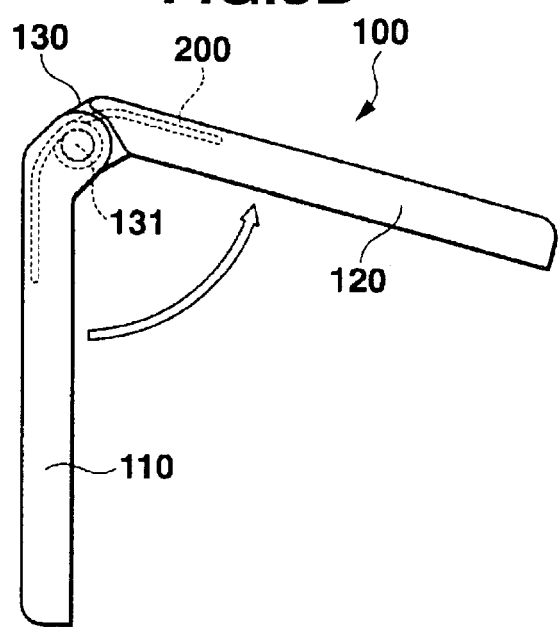
Figure 8D:
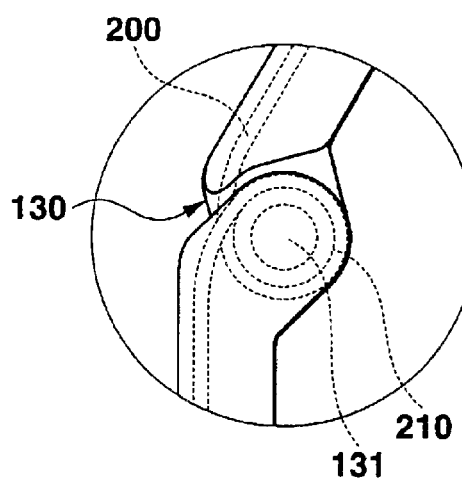
Figure 8C:
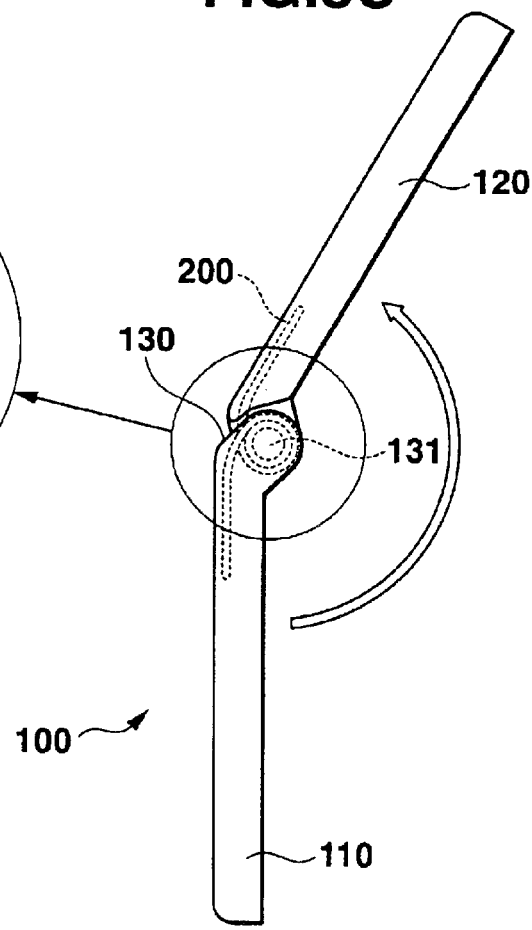

The second embodiment of the present invention will be described with reference to FIG. 7. In the second embodiment, the foldable electronic device according to the present invention will be exemplified by a foldable portable cellular phone set 1A having a two-axis hinge 30A. FIG. 7 is a plan view of the portable cellular phone set 1A in an open state.

The portable cellular phone set 1A is built up of first and second casings 10A and 20A, two-axis hinge 30A, FPC cable (not shown), and the like. The first casing 10A includes a display 10B and the like. The second casing 20A includes an image sensing portion 20B, operating portion 20C, and the like. The two-axis hinge 30A pivotally connects the first and second casings 10A and 20A. The FPC cable electrically connects components in the first and second casings 10A and 20A.

The display 10B, a loudspeaker 10C, and the like are mounted in the first casing 10A. The display 10B displays the still and motion image information of an object. The image sensing portion 20B, operating portion 20C, a microphone 20D, a controller (not shown), and the like are mounted in the second casing 20A. The image sensing portion 20B includes a lens, CCD, and the like. The operating portion 20C includes a crisscross key, ten-key pad, and the like. The controller comprehensively controls the entire portable cellular phone set 1A. The controller is electrically connected to the image sensing portion 20B and operating portion 20C. The controller is also electrically connected to the display 10B of the first casing 10A through the FPC cable.

The two-axis hinge 30A includes first and second pivot shafts, and the like. The first and second pivot shafts are to be respectively fixed to the first and second casings 10A and 20A. The arrangement of the two-axis hinge 30A is substantially the same as that of the two-axis hinge 30 (see FIGS. 1 through 3C) of the first embodiment. The FPC cable includes first and second bent portions and the like. The first and second bent portions are to be respectively wound around the first and second pivot shafts of the two-axis hinge 30A to form first and second wound portions. The arrangement of the FPC cable is substantially the same as that of the FPC cable 40 (see FIG. 4) of the first embodiment.

A winding method for the FPC cable is substantially the same as the winding method (see FIGS. 5A through 5E) for the FPC cable 40 of the first embodiment. More specifically, the first bent portion of the FPC cable is wound around the first pivot shaft of the two-axis hinge 30A to form the first wound portion. The second bent portion of the FPC cable is wound around the second pivot shaft of the two-axis hinge 30A to form the second wound portion. The winding directions of the first and second wound portions are set opposite to each other.

In the portable cellular phone set 1A according to the second embodiment described above, the FPC cable is arranged in the two-axis hinge 30A. The first wound portion of the FPC cable is formed around the first pivot shaft of the two-axis hinge 30A. The second wound portion of the FPC cable is formed around the second pivot shaft of the two-axis hinge 30A. The winding directions of the first and second wound portions are set opposite to each other.

As the first and second casings 10A and 20A are pivoted in the opposite directions, the first wound portion of the FPC cable is unwound, and the cable is gradually fed to the second wound portion side. In this case as well, the fed-out cable can be taken up by the second pivot shaft. The enlargement of the first wound portion of the FPC cable can be suppressed, so that the storing space in the two-axis hinge 30A for the FPC cable can be decreased. As a result, the decrease in size and weight of the portable cellular phone set 1A can be achieved.

In the above embodiments, the present invention is applied to the foldable digital camera 1 and portable cellular phone set 1A in each of which the first and second casings are pivotally connected to each other through the two-axis hinge. The present invention can also be applied to other foldable electronic devices having similar structures (e.g., a foldable PDA, foldable notebook PC, foldable electronic dictionary, foldable electronic book, and the like).

In the above embodiments, the present invention is applied to an elongated band-like FPC cable. The present invention can also be applied to an ordinary "wire-type" wiring cable.

In the above embodiments, the wound portions (first and second wound portions) of the FPC cable are formed around two pivot shafts (first and second pivot shafts). Even if no pivot shafts are provided and a wound portion is formed merely by winding an FPC cable, the same effect can be obtained.

In the above embodiments, the FPC cable is arranged in the two-axis hinge having the two pivot shafts. The wound portions are formed around the two pivot shafts. Alternatively, a wiring cable according to the present invention may be arranged in a hinge having three or more pivot shafts, and wound portions may be formed around the respective pivot shafts. In this case, the winding directions of the adjacent wound portions may be set opposite to each other, so that the effect of the present invention can be obtained.

In the above embodiments, the first and second gears are formed on the two-axis hinge. The fed-out amount of the cable from the first pivot shaft and the taken-up amount of the cable by the second pivot shaft are set to coincide with each other by pivoting the first and second casings by the same angle in the opposite directions. The first and second gears need not be formed. That is, it suffices as far as the fed-out amount of the cable and the taken-up amount of the cable substantially coincide with each other when the two casings are pivoted about the hinge as the center.

What is claimed is:

1. A foldable electronic device comprising:
   a first casing;
   a second casing;
   a two-axis hinge having first and second pivot shafts to pivotally connect the first and second casings; and
   a wiring cable to electrically connect the first and second casings through the two-axis hinge, wherein
   the wiring cable is wound around the first pivot shaft of the two-axis hinge in a first direction, and around the second pivot shaft of the two-axis hinge in a second direction opposite to the first direction.

2. A device according to claim 1, wherein first and second bent portions are formed at a substantially central portion in a longitudinal direction of the wiring cable.

3. A device according to claim 1, wherein the wiring cable is an FPC cable.

4. A device according to claim 3, wherein the FPC cable is an elongated band-like cable formed by adhering adhesive tapes to two surfaces of an array of a plurality of wire-like cables arranged at a predetermined interval.

5. A device according to claim 1, wherein the wiring cable includes a plurality of wiring cables.

6. A device according to claim 1, further comprising:
   a first gear formed on part of an outer surface of the first pivot shaft; and
   a second gear formed on part of an outer surface of the second pivot shaft and serving to mesh with the first gear.

7. A device according to claim 6, wherein the first and second gears are formed to pivot by the same angle in opposite directions.

8. A device according to claim 1, wherein
   the first pivot shaft is fixed to an end of the first casing, and
   the second pivot shaft is fixed to an end of the second casing.

9. A device according to claim 1, further comprising a bearing which pivotally supports the first and second pivot shafts.

10. A device according to claim 1, wherein an image sensing portion is mounted on the first casing.

11. A device according to claim 10, wherein
    an image display is mounted on the second casing,
    the image display serving to acquire and display through the wiring cable image information acquired by the image sensing portion.

12. A device according to claim 1, wherein a card slot portion to mount a memory card is mounted on the first casing.

13. A device according to claim 12, wherein
    an image display is mounted on the second casing, and
    the image display acquires and displays through the wiring cable image information recorded on a memory card mounted on the card slot portion.

14. A device according to claim 1, wherein an image display is mounted on the second casing.

15. A device according to claim 1, wherein
    an image display is mounted on the first casing, and
    an operating portion is mounted on the second casing.

16. A device according to claim 1, wherein the foldable electronic device is a digital camera.

17. A device according to claim 1, wherein the foldable electronic device is a cellular phone.

* * * * *

UNITED STATES PATENT AND TRADEMARK OFFICE
CERTIFICATE OF CORRECTION

PATENT NO. : 6,926,546 B2
DATED : August 9, 2005
INVENTOR(S) : Tomoyasu Kurokawa It is certified that error appears in the above-identified patent and that said Letters Patent is hereby corrected as shown below:

Column 7,
Line 51, after "direction opposite to the first direction", change "." to -- ; --.
Line 52, insert -- wherein the wiring cable is wound completely around at least one of the first and second pivot shafts. --.

Signed and Sealed this

Twentieth Day of December, 2005

JON W. DUDAS
*Director of the United States Patent and Trademark Office*